(12) United States Patent
Li et al.

(10) Patent No.: US 11,183,801 B2
(45) Date of Patent: Nov. 23, 2021

(54) POWER SUPPLY STRUCTURE

(71) Applicant: Delta Electronics (Shanghai) Co., Ltd., Shanghai (CN)

(72) Inventors: Hongming Li, Shanghai (CN); Haiyang Meng, Shanghai (CN); Liangsong Che, Shanghai (CN); Hao Lu, Shanghai (CN); Zhongwei Ke, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 16/805,819

(22) Filed: Mar. 1, 2020

(65) Prior Publication Data

US 2020/0303883 A1 Sep. 24, 2020

(30) Foreign Application Priority Data

Mar. 21, 2019 (CN) .......................... 201920361394.1

(51) Int. Cl.
*H01R 13/74* (2006.01)

(52) U.S. Cl.
CPC ......... *H01R 13/743* (2013.01); *H01R 13/748* (2013.01)

(58) Field of Classification Search
CPC .. G06F 1/188; H05K 7/20172; H05K 7/1492; H05K 7/1432; H05K 7/20909; H01R 13/447
See application file for complete search history.

(56) References Cited

U.S. PATENT DOCUMENTS

| | | | |
|---|---|---|---|
| 7,215,542 B2 * | 5/2007 | Chen | H05K 7/20909 219/130.1 |
| 7,813,128 B2 * | 10/2010 | Marchand | H05K 7/20909 361/694 |
| 9,606,585 B2 * | 3/2017 | Tunks | G06F 1/188 |
| 2008/0266792 A1 * | 10/2008 | Li | H05K 7/20909 361/695 |
| 2010/0117453 A1 * | 5/2010 | Langgood | H01R 13/447 307/75 |
| 2013/0182416 A1 * | 7/2013 | Wilson | F21V 23/06 362/147 |
| 2014/0029191 A1 * | 1/2014 | Terwilliger | H05K 7/20172 361/679.31 |

FOREIGN PATENT DOCUMENTS

| | | |
|---|---|---|
| CN | 101128106 A | 2/2008 |
| CN | 100574589 C | 12/2009 |
| CN | 105094258 A | 11/2015 |
| CN | 205846342 U | 12/2016 |
| CN | 207573829 U | 7/2018 |
| TW | I259753 B | 8/2006 |
| TW | M297580 U | 9/2006 |
| TW | I318099 B | 12/2009 |
| WO | 2009075953 A2 | 6/2009 |

* cited by examiner

*Primary Examiner* — Jean F Duverne
(74) *Attorney, Agent, or Firm* — CKC & Partners Co., LLC

(57) ABSTRACT

A power supply structure comprises a housing, a socket and a fan. The housing has a main housing, a terminal housing and a front panel, wherein the terminal housing connected with the main housing. The fan and the terminal housing disposed on one end of the main housing, and the fan attached to the front panel. The socket arranged in parallel with the fan and connected to the terminal housing.

20 Claims, 5 Drawing Sheets

POWER SUPPLY STRUCTURE

CROSS-REFERENCE TO RELATED APPLICATIONS

This non-provisional application claims priority under 35 U.S.C. § 119(a) on Patent Application No. 201920361394.1 filed in P. R. China on Mar. 21, 2019, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

FIELD OF THE INVENTION

The present invention relates to a power supply structure, in particular, the power supply structure with a fan and a socket arranged in parallel at a front end of a housing.

BACKGROUND OF THE INVENTION

With the rapid development of cloud computing and artificial intelligence (AI), the power demand is increasing in network and server equipment, and the dimension requirement of the power supply device in the network and server equipment is stricter.

In the existing structure, a fan is disposed inside the power supply device, and a socket is disposed on a front panel of the power supply device. In such arrangement, a part of PCB inside the power supply device has to be cut off to accommodate the fan, which not only weakens the strength of the PCB but also inconvenience for electrical wiring and layout. Moreover, installing the fan inside the power supply device cannot efficiently dissipate heat from the socket.

As for the power supply device with no dimensional limitations, the way of arranging the fan and the socket in parallel and connected with the panel of the power supply device is developed. Generally, a fan with a size smaller than the width of the power supply device is arranged to leave a space for wires for electrical signal connections inside the power supply device. However, the fan having a smaller size means that heat dissipation performance is reduced, which significantly limits the heat dissipation and the output power of the power supply device. Thereby, a power density of the switching power supply cannot be greatly improved. Even more, such design can't satisfy the customers' requirements on system function and power demand. On the other hand, the type of the socket needs to match the power of the power supply device. Therefore, with the increasing of the power, the socket with a smaller size cannot meet the requirements for the power supply device. Selecting a socket with a higher power level can fulfill the requirements of the power supply for the current carrying capacity, but the external dimensions thereof will also be greatly increased.

Therefore, due to the dimensional limitation, the existing power supply device cannot install both the power-matching fan and socket in parallel on the panel. Therefore, it is urgent to develop a power supply structure to overcome the above deficiencies.

SUMMARY OF THE INVENTION

An objective of the present invention is to provide a power supply structure overcoming at least one drawbacks of the prior art. This objective can be achieved by a power supply structure comprising a housing having a main housing, a terminal housing connected with the main housing, and a front panel; a fan disposed on one end of the main housing where the terminal housing is disposed, and detachably attached to the front panel; and a socket arranged adjacent to the fan and detachably connected to the terminal housing.

BRIEF DESCRIPTION OF THE DRAWINGS

Reference will now be made in detail to embodiments of the present invention, examples of which are illustrated in the accompanying drawings, wherein.

DETAILED DESCRIPTION OF THE PREFERRED EMBODIMENT

The invention will now be described in details through following illustrative embodiments. However, it should be understood that an element, a structure or a feature in an embodiment can be beneficially incorporated into other embodiments without further recitation.

Hereinafter the invention is further described in detail with reference to the accompanying drawings and specific embodiments. The embodiments are carried out on the premise of the technical solution of the invention with embodiments and operation processes, but the extent of protection of the invention is not limited to the embodiments below.

Figure 1:
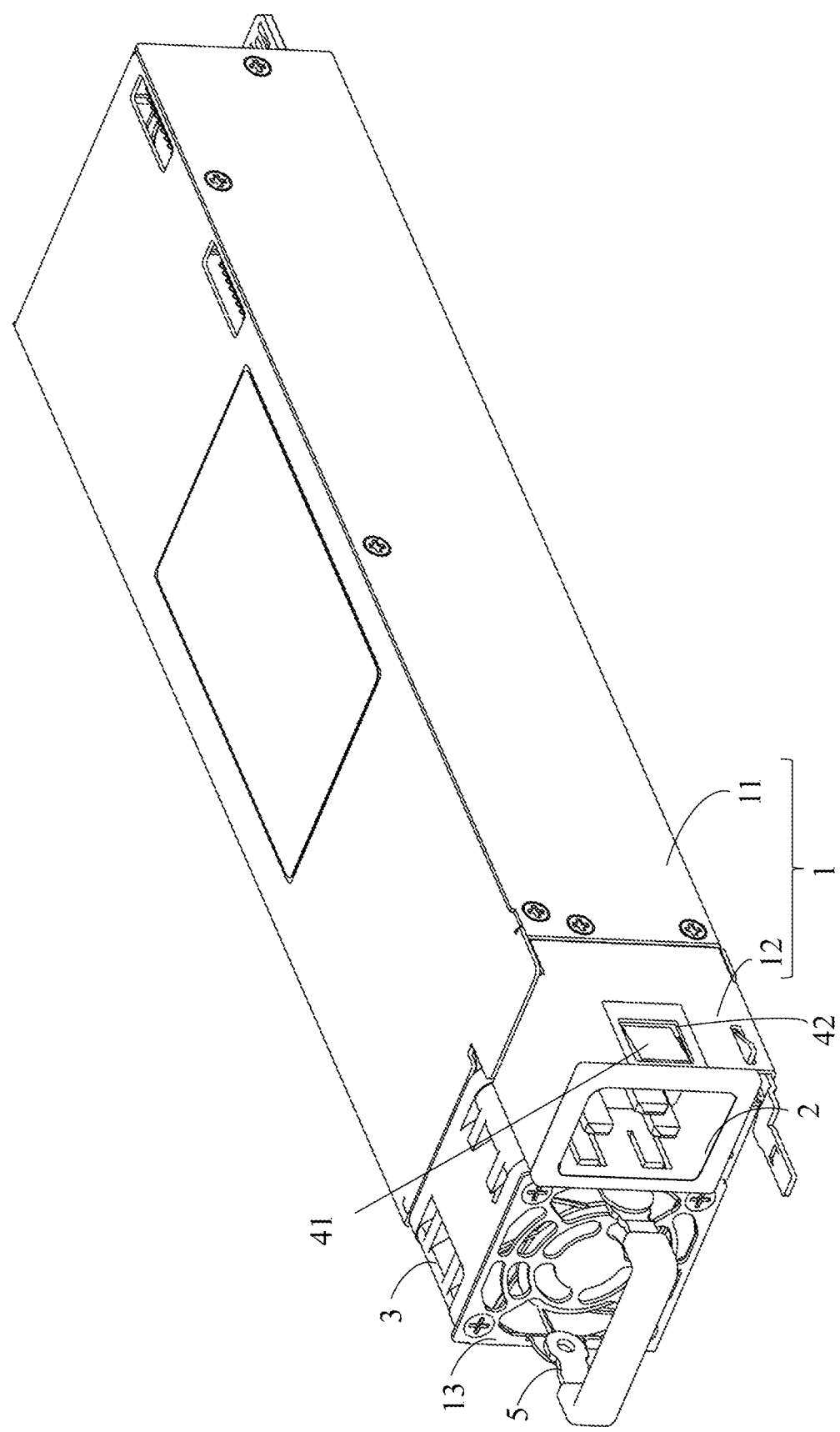
FIG. 1 is an overall view of the power supply structure according to a first embodiment of the present invention.
Figure 2:
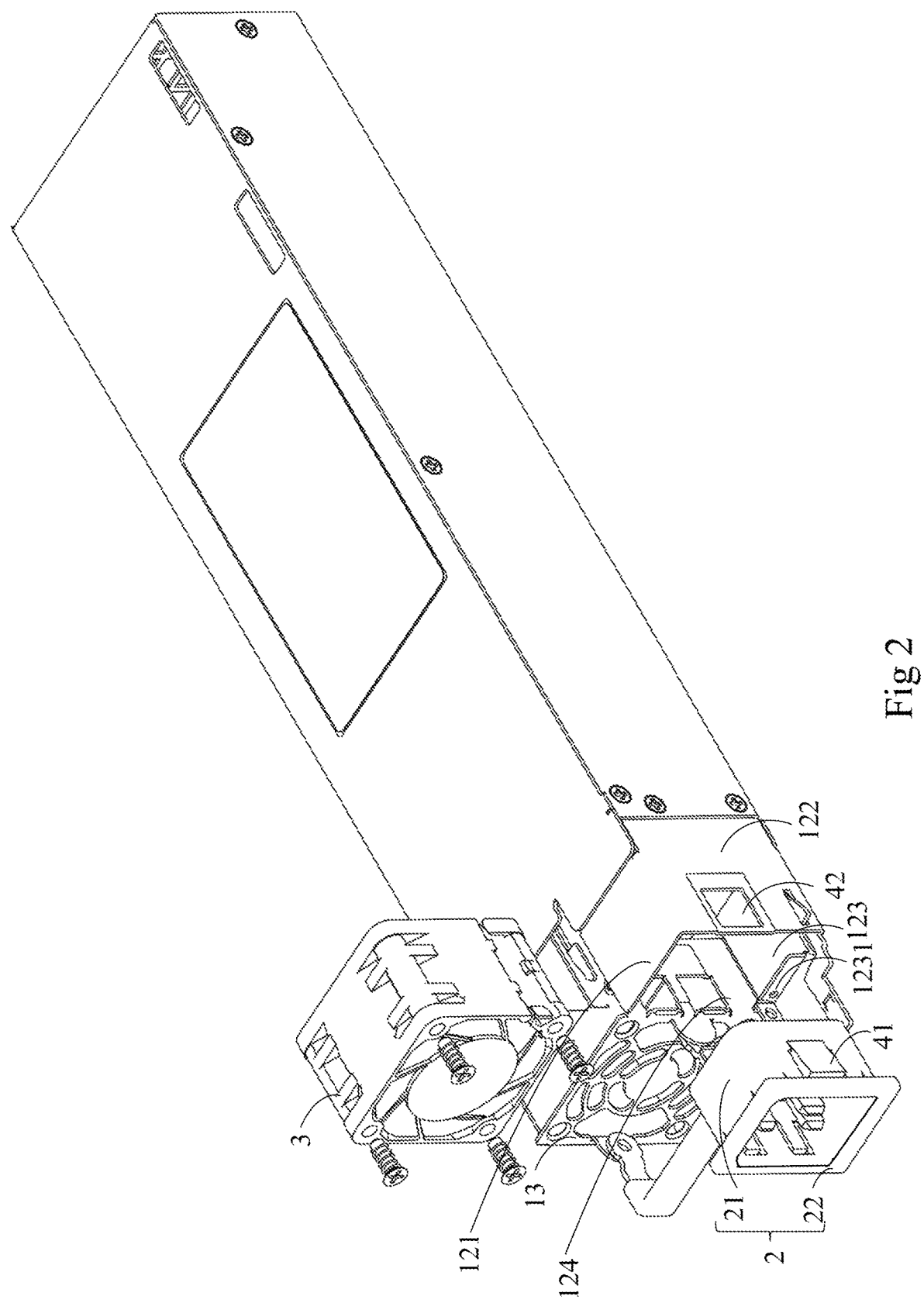
FIG. 2 is an exploded view of FIG. 1.

Referring to FIGS. 1-2, FIG. 1 is an overall view of the power supply structure according to the first embodiment of the present invention, and FIG. 2 is an exploded view of FIG. 1. As shown in FIGS. 1-2, the power supply structure of the present invention comprises a housing 1, a socket 2, and a fan 3. The housing 1 comprises a main housing 11, a terminal housing 12 connected with the main housing 11, and a front panel 13. The terminal housing 12 is located at a front end of the main housing 11. The fan 3 is disposed at the front end of the main housing 11, and is detachably attached to the front panel 13. The socket 2 is arranged adjacent to the fan 3, and is detachably connected to the terminal housing 12. In this embodiment, the fan 3 is secured to the front panel 13 by screws.

It should be noted that, in this embodiment, the terminal housing 12 and the main housing 11 are separated components and are spliced together through fasteners, such as rivets, screws. However, the present invention is not limited thereto. In another embodiment, the terminal housing 12 and the main housing 11 may be formed integrally in one piece.

In this embodiment, the socket 2 is provided with at least one clip 41, which is connected to the terminal housing 12 in a snap-fit manner. The socket 2 comprises four sidewalls 21, i.e. upper, lower, left, and right sidewalls 21, and a protruding portion 22. The four sidewalls 21 are arranged in periphery and connected with each other. At least one pair of the opposite sidewalls 21 is provided with the clips 41. For example, the clips 41 can be disposed on the upper and lower sidewalls 21, or the clips 41 can be disposed on the left and right sidewalls 21.

The terminal housing 12 comprises a top plate 121, a side plate 122, a bottom plate 123, and a baffle plate 124, which are sequentially arranged in periphery and connected with each other. The baffle plate 124 is located between the socket 2 and the fan 3. The baffle plate 124 and the front panel 13 may be formed integrally in one piece. In this embodiment, the side plate 122 and the baffle plate 124 are respectively provided with clip holes 42. Two clips 41 are disposed on the sidewalls 21 corresponding to the clip holes 42, for being respectively connected to the clip holes 42 in a snap-fit manner. The present invention can further decrease the dimensions of the power supply structure in a width direction by snap-fitting the socket in the terminal housing through clips and arranging the terminal housing and the fan adjacently in parallel.

It is understood that the socket and the terminal housing may be connected with each other through other ways. For example, in some embodiments, the socket 2 can be molded to be provided with a threaded hole while the terminal housing can also be provided with a threaded hole, so that the socket and the terminal housing can be connected through screws. Alternatively, the socket and the terminal housing can be connected with each other through other fasteners. The present invention is not limited thereto.

In some embodiment, since the opening height of the terminal housing 12 is higher than that of the socket 2, in order to better snap fit the socket within the terminal housing 12, the bottom plate 123 of the terminal housing 12 may be further provided with a bend portion 1231. The bend portion 1231 is perpendicular to the bottom plate 123, such that the socket 2 (e.g. of the C20 type) is capable to fit into and positioned in the terminal housing 12. A protruding portion 22 of the socket 2 is protruded beyond an outer edge formed by the bend portion 1231, the top plate 121, the side plate 122, and the baffle plate 124. In other embodiments, the bend portion 1231 is arranged to extend from and perpendicular to the top plate 121. The present invention is not limited thereto. Yet, in another embodiment, the bend portion 1231 may be replaced by a stand and/or a boss which is formed perpendicular to the bottom plate 123 or the top plate 121.

Figure 3:
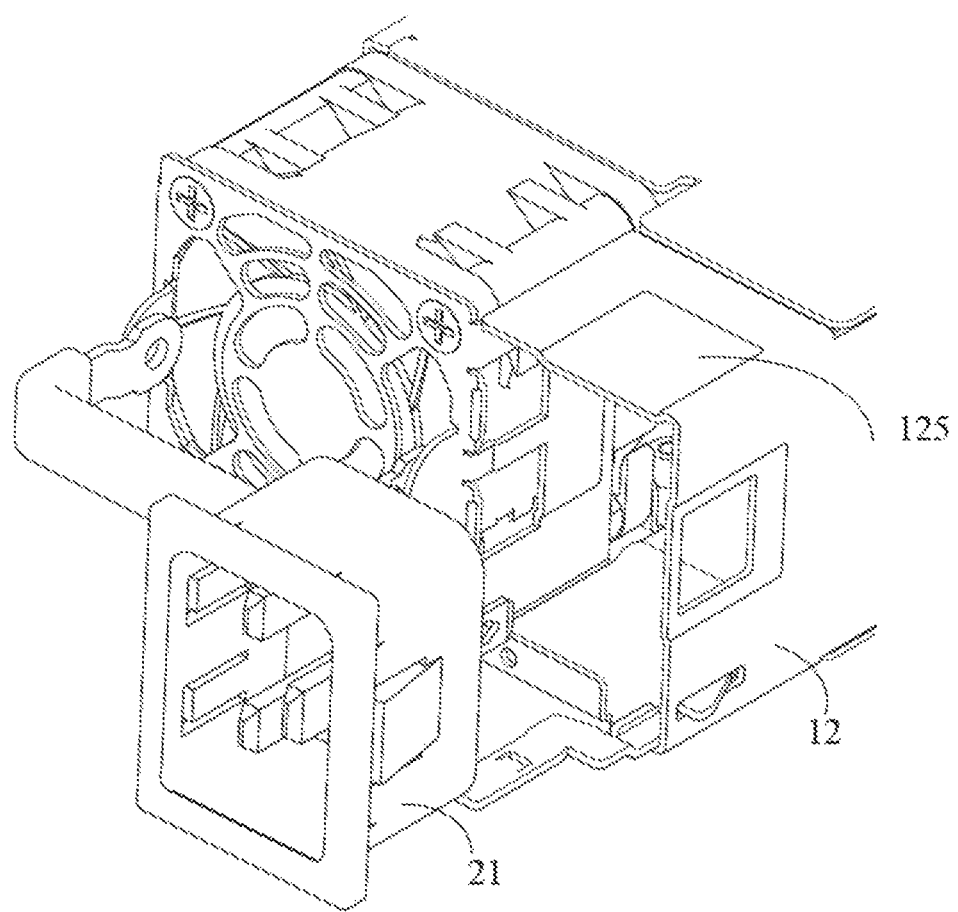
FIG. 3 is a partial view of the power supply structure according to a second embodiment of the present invention.

Furthermore, referring to FIG. 3, it is a partial view of the power supply structure according to another embodiment of the present invention. For the most part, the power supply structure shown in FIG. 3 are the same as the power supply structure shown in FIG. 1. For the sake of brevity, the same parts are not repeated herein. The different parts are now explained as below. In this embodiment, the terminal housing 12 further includes a recess portion 125, which is located in the top plate 121 of the terminal housing 12 for pressing against the socket 2. In some embodiments, the recess portion can be located in the side plate 122 of the terminal housing 12 for pressing against the socket 2, and the clip holes 42 is disposed on the recess portion.

In some embodiments, the front panel 13 is further provided with a handle 5.

In some embodiments, the power supply of the present invention is a 1U power supply, and the socket 2 is a C20 socket.

Figure 4:
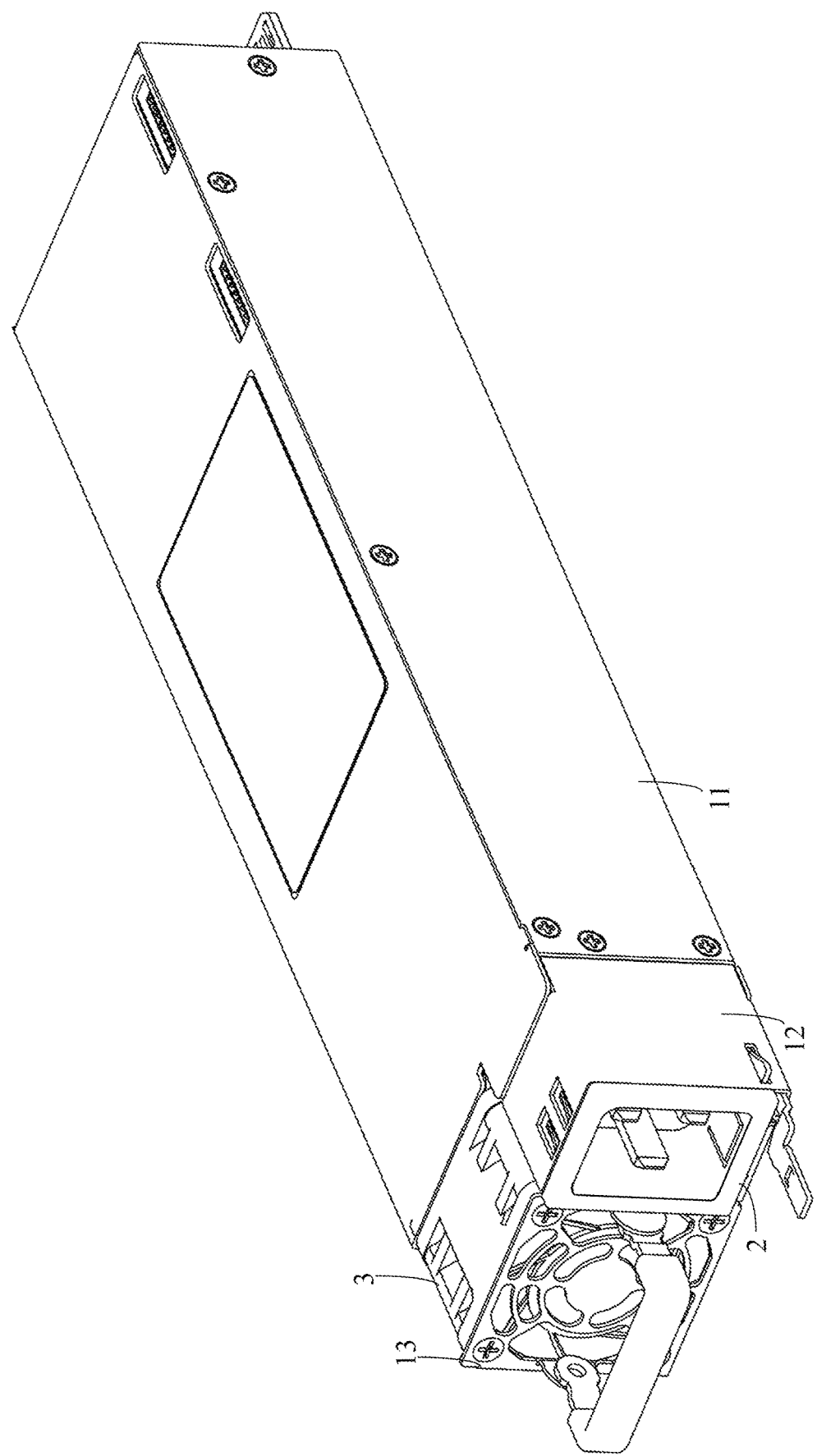
FIG. 4 is an overall view of the power supply structure according to a third embodiment of the present invention.
Figure 5:
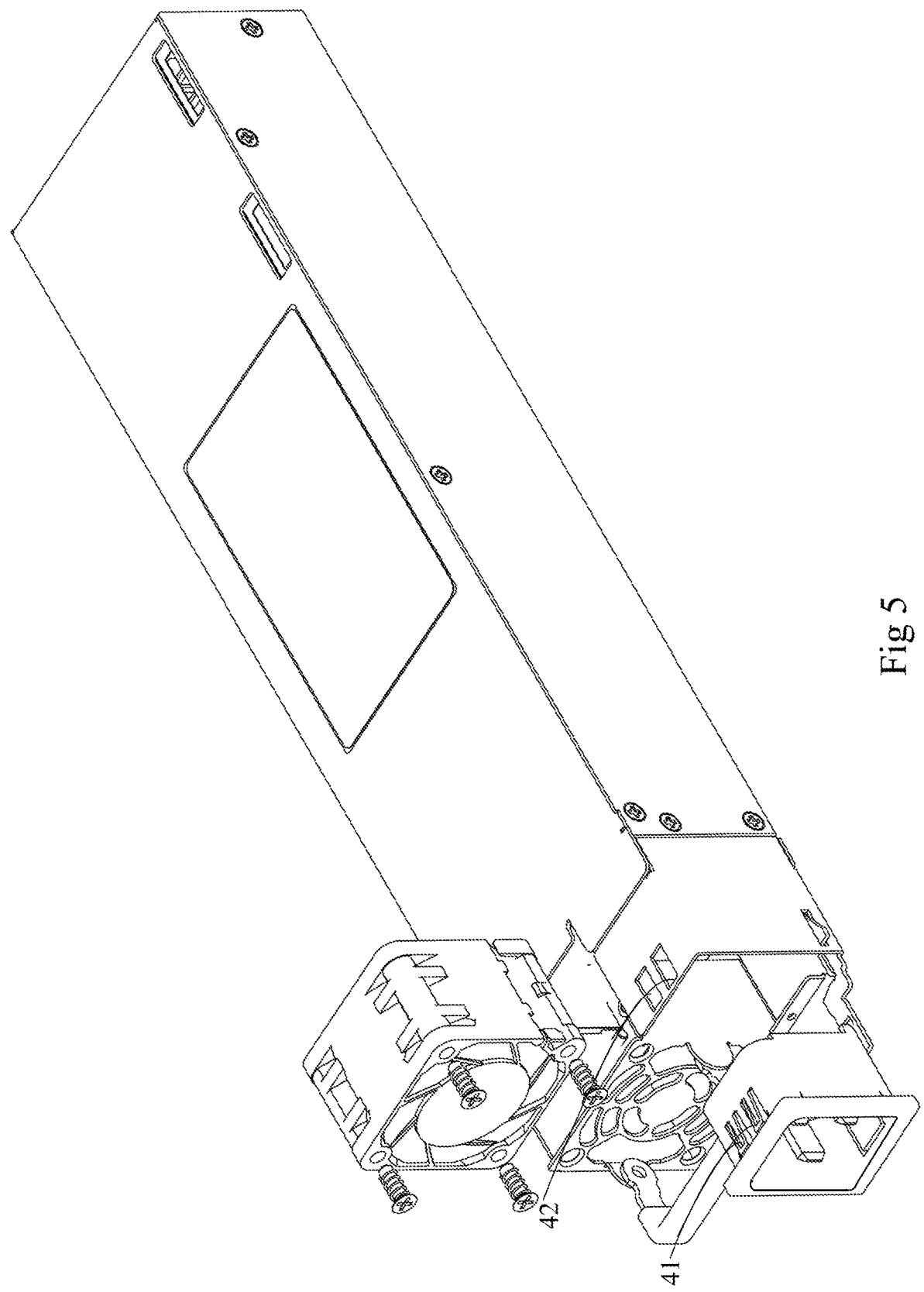
FIG. 5 is an exploded view of FIG. 4.

Referring to FIGS. 4-5, FIG. 4 is an overall view of the power supply structure according to another embodiment of the present invention, and FIG. 5 is an exploded view of FIG. 4. For the most part, the power supply structure shown in FIGS. 4-5 are the same as the power supply structure shown in FIGS. 1-2, thus the same parts are not repeated herein. The different parts are now explained as below. As shown in FIGS. 4-5, in this embodiment, the top plate 121 of the terminal housing 12 is provided with clip holes 42. The bottom plate 123 includes a bend portion 1231, which is perpendicular to the bottom plate 123. The clips 41 are disposed on the sidewalls, such as the upper and lower sidewalls, of the socket 2 corresponding to the clip holes 42 and the bend portion 1231. The socket 2 is connected to the terminal housing 12 in snap-fit manner via the clip holes 42 on the top plate 121, the bend portion 1231 on the bottom plate 123, and the clips 41.

In another embodiment of the present invention, the clip hole 42 is disposed on the bottom plate 123 of the terminal housing 12. The top plate 121 is provided with a bend portion perpendicular thereto. The structure of said bend portion is the same as the bend portion 1231. The socket 2 is connected to the terminal housing 12 in snap-fit manner via the clip hole on the bottom plate 123, the bend portion on the top plate 121, and the clips.

In another embodiment of the present invention, both the bottom plate 123 and the top plate 121 of the terminal housing 12 are provided with a bend portion respectively. The structure of said bend portion is similar as the bend portion 1231, and is correspondingly perpendicular to the bottom plate 123 and the top plate 121 respectively. The clips 41 on the socket are respectively connected to the two bend portions in the snap-fit manner.

It should be noted that, in these embodiments, since the clips are secured by the clip holes and/or bend portions disposed on the top plate 121 or the bottom plate 123 of the terminal housing 12 in the snap-fit manner, it is not necessary to dispose the baffle plate between the fan 3 and the socket 2. In other word, the baffle plate can be removed (not shown). Therefore, the opening width of the power supply structure of the present invention can be reduced by at least the thickness of the baffle plate. Furthermore, the width of the power supply structure of the present invention can be further reduced by the arrangement of the clips on the upper and lower sidewalls of the socket 2.

In some embodiments, the terminal housing 12 further comprises a recess portion 125 (not shown in the figure) located on the side plate 122 of the terminal housing 12, for pressing against the socket 2 towards the inside of the terminal housing 12.

In conclusion, the power supply structure of the present invention with the fan and the socket are disposed in parallel at the front end of the housing does not need to reserve a space of the PCB to dispose the fan. Such arrangement of the present invention advantageously increases the strength and optimizes the layout of the PCB, and efficiently saves and utilizes the inner space of the power supply structure. Moreover, the fan can dissipate the heat from all components inside the housing, it could improve the power density of the power supply structure. On the other hand, due to the snap-fit connection between the socket and the housing and the parallel arrangement of the socket and the fan, the power supply structure can increase the power without increasing the dimension of the width. Moreover, the socket with the large dimensions for power matching can be selected, which can meet the requirement for the current carrying capacity, and thereby satisfy the different system functions and the power requirements.

The detailed description above is provided to illustrate specific embodiments of the present invention and is not intended to be limiting. Numerous variations and modifications within the scope of the present invention are possible. The present invention is set forth in the following claims. Although several preferred embodiments of the present invention have been described, the present invention may be used with other configurations. It will be appreciated by those skilled in the art that, the present invention could have many other embodiments, and changes and modifications may be made thereto without departing from the invention in its broader aspects and as set forth in the following claims and equivalents thereof.

What is claimed is:

1. A power supply structure, comprising:
   a housing having a main housing, a terminal housing connected with the main housing, and a front panel, wherein the terminal housing is disposed at a front end of the main housing in a first direction;
   a fan disposed at the front end of the main housing and detachably attached to the front panel; and
   a socket arranged at the front end of the main housing in parallel with the fan in a second direction that is generally perpendicular to the first direction, and connected to the terminal housing.

2. The power supply structure according to claim 1, wherein the socket is provided with a clip connected to the terminal housing in a snap-fit.

3. The power supply structure according to claim 2, wherein the socket comprises four sidewalls connected with each other, and the clips are arranged on one pair of the opposite sidewalls of the four sidewalls.

4. The power supply structure according to claim 2, wherein the terminal housing comprises a top plate, a side plate, and a bottom plate, which are sequentially connected with each other.

5. The power supply structure according to claim 4, wherein the terminal housing further comprises a baffle plate located between the socket and the fan, wherein the top plate, the side plate, the bottom plate, and the baffle plate are sequentially connected with each other.

6. The power supply structure according to claim 5, wherein the baffle plate and the front panel are integrally formed in one piece.

7. The power supply structure according to claim 5, wherein the side plate and the baffle plate are respectively provided with a clip hole, to which the clips on the socket are respectively connected in the snap-fit.

8. The power supply structure according to claim 7, wherein the terminal housing further comprises a recess portion located on either one of the top plate and the bottom plate, for pressing against the socket.

9. The power supply structure according to claim 4, wherein the top plate of the terminal housing is provided with a clip hole, and the bottom plate of the terminal housing comprises a bend portion perpendicular thereto, wherein the clips on the socket are respectively connected to the clip hole and the bend portion in the snap-fit.

10. The power supply structure according to claim 9, wherein the terminal housing further comprises a recess portion located on the side plate of the terminal housing, for pressing against the socket.

11. The power supply structure according to claim 4, wherein the bottom plate of the terminal housing is provided with a clip hole, and the top plate of the terminal housing comprises a bend portion perpendicular thereto, wherein the clips on the socket are respectively connected to the clip hole and the bend portion in the snap-fit.

12. The power supply structure according to claim 11, wherein the terminal housing further comprises a recess portion located on the side plate of the terminal housing, for pressing against the socket.

13. The power supply structure according to claim 4, wherein both the bottom plate and the top plate comprise a bend portion perpendicular to the respective bottom and top plates, wherein the clips on the socket are respectively connected to the bend portion in the snap-fit.

14. The power supply structure according to claim 13, wherein the terminal housing further comprises a recess portion located on the side plate of the terminal housing, for pressing against the socket.

15. The power supply structure according to claim 1, wherein the socket is detachably connected with the terminal housing through either one of a screw and a fastener.

16. The power supply structure according to claim 1, wherein the terminal housing and the main housing are integrally formed in one piece.

17. The power supply structure according to claim 1, wherein the terminal housing and the main housing are spliced by a fastener.

18. The power supply structure according to claim 1, wherein the fan is secured to the front panel by a screw.

19. The power supply structure according to claim 1, wherein the socket is a C20 socket.

20. The power supply structure according to claim 1, wherein the front panel is further provided with a handle.

* * * * *